United States Patent [19]

Risch et al.

[11] 4,331,709

[45] May 25, 1982

[54] PROCESS OF REDUCING DENSITY OF FAST SURFACE STATES IN MOS DEVICES

[75] Inventors: Lothar Risch, Ottobrunn; Erich Pammer, Taufkirchen; Karlheinz Friedrich, Neuried, all of Fed. Rep. of Germany

[73] Assignee: Siemens Aktiengesellschaft, Berlin and Munich, Fed. Rep. of Germany

[21] Appl. No.: 171,180

[22] Filed: Jul. 22, 1980

[30] Foreign Application Priority Data

Aug. 10, 1979 [DE] Fed. Rep. of Germany ....... 2932569

[51] Int. Cl.$^3$ .................. H01L 21/324; H01L 21/318
[52] U.S. Cl. ..................................... 427/94; 357/24; 427/39; 427/95
[58] Field of Search ........................ 427/39, 86, 94, 95

[56] References Cited

U.S. PATENT DOCUMENTS 4,113,514  9/1978  Pankove et al. ..................... 148/1.5
4,181,751  1/1980  Hall et al. ............................. 427/94

OTHER PUBLICATIONS

C. H. Sequin et al., "Charge Transfer Devices", 1975, pp. 11–12.

B. E. Deal, "The Current Understanding of Charges in the Thermally Oxidized Silicon Structure", J. Electrochem. Soc., Vol. 121, No. 6, 1974, pages 198C–205C.

Matysik et al., "Hydrogen Evolution from Plasma-Deposited Amorphous Silicon Films" J. Vac. Sci. Technol. 15(2) Mar./Apr. 1976.

Malhotra et al., "Effects of Hydrogen Contamination on the Localized States in Amorphous Silicon" Applied Physics Letters, vol. 28, No. 1, 1 Jan. 1976.

*Primary Examiner*—John D. Smith
*Attorney, Agent, or Firm*—Hill, Van Santen, Steadman, Chiara & Simpson

[57] ABSTRACT

Fast surface states in MOS devices, such as SCCDs, are reduced by depositing a relatively thin amorphous layer containing silicon and hydrogen onto the $SiO_2$ surface of such devices and annealing the resultant device in a non-oxidizing atmosphere for brief periods of time at a temperature in excess of the deposition temperature for the amorphous layer but below about 500° C. so that free valences at the $Si-SiO_2$ interface region are saturated with hydrogen. Surface state densities of about $4 \times 10^8 \, cm^{-2}eV^{-1}$ and SCCDs having $\epsilon = 1.10^{-5}$ can be achieved via this process. The process is useful in producing SCCDs with low surface state densities and other MOS devices having low surface generated dark currents.

3 Claims, 3 Drawing Figures

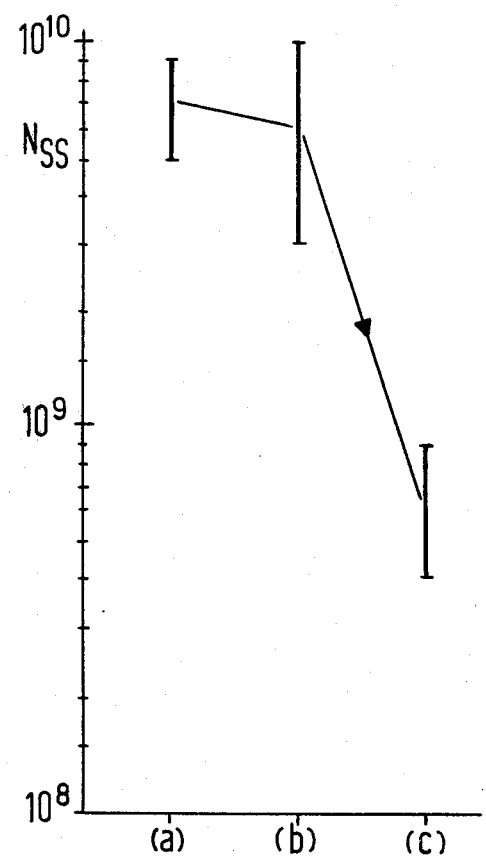

4,331,709

PROCESS OF REDUCING DENSITY OF FAST SURFACE STATES IN MOS DEVICES

BACKGROUND OF THE INVENTION

1. Field of the Invention

The invention relates to MOS devices and somewhat more particularly to a process of reducing density of fast surface states in MOS devices, such as surface-charge-coupled devices (SCCDs).

2. Prior Art

In surface-charge-coupled devices, for example as described by C. H. Sequin et al, *Charge Transfer Devices*, Academic Press Inc., New York, pages 11 and 12, (1975), low surface state densities at Si-SiO$_2$ interface regions are of primary importance in regards to transmission properties (and dark currents) associated with such devices.

Normally, the production of MOS devices comprises a careful gate oxidation followed by hydrogen annealing in a gas atmosphere. B. E. Deal, "The Current Understanding Of Charges In The Thermally Oxidized Silicon Structure", *J. Electrochem. Soc.*, Vol. 121, No. 6, pages 198C through 205C (1974) suggests that hydrogen saturates so-called "dangling" bonds at Si-SiO$_2$ interface regions in semiconductor structures. During such saturation, the dissociation of the H$_2$ molecules into atomic hydrogen is of primary importance. This saturation occurs during annealing in a hydrogen atmosphere at a temperature in the range from about 400° C. to 500° C. over a time period of about 30 minutes. Surface state densities which can be achieved by means of this process are about $(5-10)\times 10^9$ cm$^{-2}$ eV$^{-1}$. In the case of SCCDs this means a transfer loss, $\epsilon$, of about $(1-2)\times 10^4$, which is inadequate for many applications.

SUMMARY OF THE INVENTION

The invention provides improved process for reducing surface state densities in MOS devices and in optimizing the transfer properties of SCCDs devices.

In accordance with the principles of the invention, after completion of a MOS device which includes a Si-SiO$_2$ interface region with the SiO$_2$ defining a free surface and having electrodes therein, a relatively thin amorphous dielectric layer comprised of silicon and hydrogen is deposited onto the free SiO$_2$ surface and the resultant structure is annealed in a non-oxidizing atmosphere at a temperature above the deposition temperature for the amorphous layer but below 500° C. This annealing process breaks up the Si-H bonds in the amorphous layer and releases the atomic hydrogen for saturating free valences at the Si-SiO$_2$ interface region.

In accordance with the preferred embodiments of the invention, the deposition of the amorphous layer occurs via a CVD reaction (chemical vapour deposition) in an electric low-pressure glow discharge system which preferably includes a plate reactor, with the gas pressure within such system being adjustable over the range of about 50 to 300 mTorr. In preferred embodiments, the deposition temperature utilized in depositing the amorphous layer ranges from about 100° C. to 450° C.

In preferred embodiments of the invention, the amorphous layer is deposited from a reaction gas comprised of silanium (SiH$_4$) which, in certain embodiments may be admixed with a nitrogen-containing gas, preferably selected from the group consisting of nitrogen, ammonia and mixtures thereof. In this manner, the amorphous layer, in addition to containing silicon and hydrogen, also contains nitrogen so that during the subsequent annealing process, the amorphous layer is prevented from being transformed into a polycrystalline state.

In preferred embodiments of the invention, the amorphous layer thickness ranges from between about 1000 to 10,000 angstroms. Further, in preferred embodiments of the invention, the atomic ratio of silicon to hydrogen in the amorphous layer varies between about 2 to 10 and in embodiments where nitrogen is incorporated within such amorphous layer, the maximum atomic ratio of nitrogen to silicon is about 1.3.

In preferred embodiments of the invention, the non-oxidizing atmosphere utilized during annealing is comprised of a gas selected from the group consisting of hydrogen, inert gases and mixtures thereof and the annealing occurs over a time period of at least about 5 minutes.

By optimizing the principles of the invention, surface state densities of about $(6\pm 2)\times 10^8$ cm$^{-2}$eV$^{-1}$ are readily achieved.

BRIEF DESCRIPTION OF THE DRAWINGS

FIG. 3 is a curve diagram of typical surface state densities, N$_{SS}$, in three similar devices treated in different manners.

DESCRIPTION OF THE PREFERRED EMBODIMENTS

The invention provides a process of reducing surface state densities in MOS devices and in optimizing the transfer properties of SCCDs.

In accordance with the principles of the invention, after the completion of a select device structure, a relatively thin amorphous dielectric layer containing silicon and hydrogen is deposited on the device surface, which has been provided with electrodes, and the resultant structure is then annealed in a non-oxidizing atmosphere for relatively brief periods of time at a temperature above the amorphous layer deposition temperature and below 500° C.

The amorphous layer deposition process is carried out during the production of desired MOS devices in addition to the normal double-polysilicon process. Prior to the annealing step, contact windows can be etched into the amorphous silicon-hydrogen layer by conventional photoresist techniques so that, for example, gold wire contacts can be provided to the device prior to the annealing step.

The reduction of surface state densities is governed decisively by the annealing process which is carried out in a non-oxidizing atmosphere after the deposition of the amorphous layer. The non-oxidizing atmosphere is preferably composed of a gas selected from the group consisting of hydrogen, an inert gas, mixtures thereof and most preferably nitrogen. The amorphous layer is deposited at a select deposition temperature from a suitable reaction gas, preferably comprised of silanium (SiH$_4$), which in certain embodiments can be diluted with a nitrogen-containing gas, such as N$_2$, NH$_3$ and mixtures thereof. The inclusion of nitrogen in the amorphous layer prevents the amorphous layer from being transformed into a polycrystalline state during the subsequent annealing process.

The amorphous layer is deposited in a thickness ranging from out 1000 to 10,000 Å. The atomic ratio of silicon to hydrogen in the amorphous layer ranges from about 2 to 10 and in embodiments where nitrogen is present in such layer, the atomic ratio of nitrogen to silicon increases from 0 to 1.3.

By following the principles of the invention, the Si-H bonds in the amorphous layer are broken-up during the annealing procedures so that atomic hydrogen is released and directly diffuses to the $SiO_2$-Si interface region where it can complex or saturate the free silicon valences. With an optimization of the principles of the invention, MOS devices having surface state densities of about $(6\pm2)\times10^8$ cm$^{-2}$ eV$^{-1}$ are attained.

Figure 1:
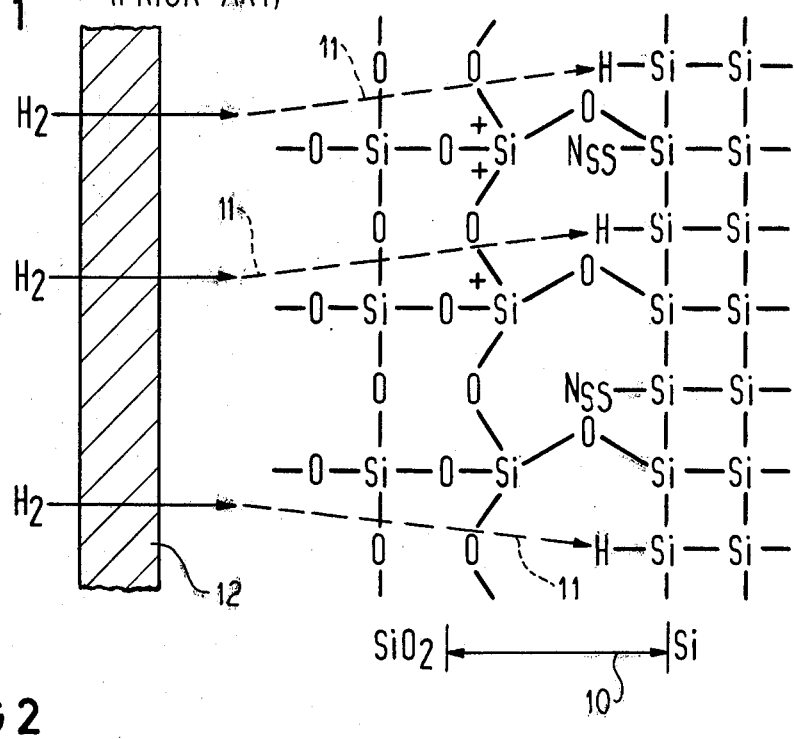
FIG. 1 is a schematic two-dimension sketch of the prior art process for saturating free valences in a Si-SiO$_2$ interface region with hydrogen.

Referring now to the drawings, FIG. 1 illustrates a $SiO_2$-Si interface region 10, with an electrode zone 12 provided on the outer or free $SiO_2$ surface undergoing hydrogen saturation from a suitable gaseous hydrogen source, $H_2$, whereby atomic hydrogen passes through the electrode zone 12, the $SiO_2$ zone and saturates the "dangling" silicon bonds, as indicated by the broken lines 11. As can be seen, not all free valences of silicon are saturated via this process and some fast surface states, $N_{SS}$, remain.

Figure 2:
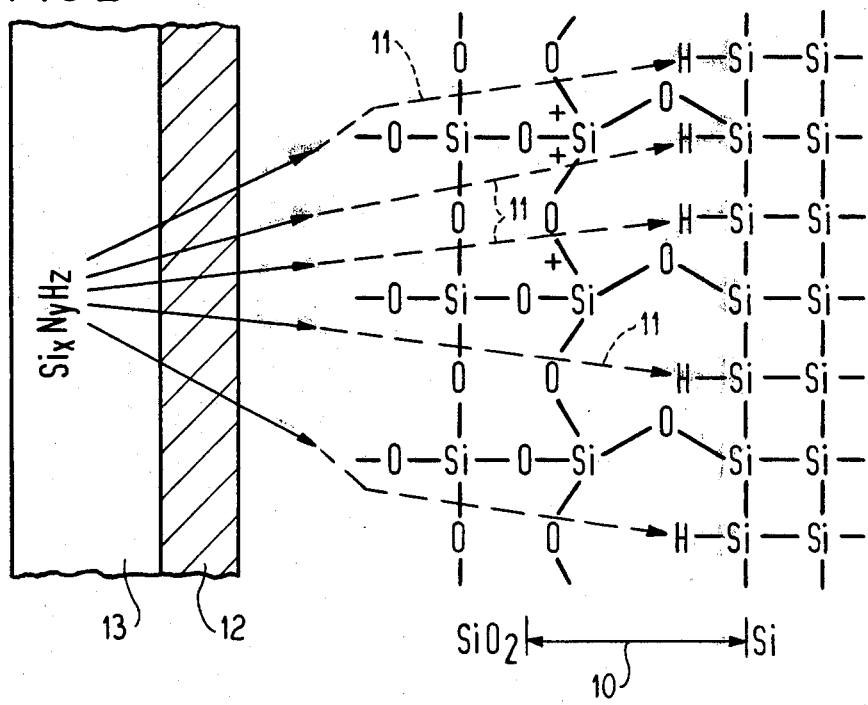
FIG. 2 is a somewhat similar schematic representation of a process occurring in accordance with the principles of the invention.

FIG. 2 illustrates a somewhat similar $SiO_2$-Si interface zone 10 of a MOS device having an electrode zone 12 on the free surface of the $SiO_2$ region, which is coated with an amorphous layer 13. In the embodiment illustrated, amorphous layer 13 is comprised of an admixture of silicon, nitrogen and hydrogen and is represented by the empirical formula $Si_xN_yH_z$ wherein x, y and z are numerals. As can be seen, with the process of the invention substantially all free valences of silicon are saturated so that a substantial reduction in the density of the fast surface states is attained.

In the two representations shown at FIGS. 1 and 2, the following reactions occur:

At FIG. 1, with $H_2$ gas:

  (1)

  (2)

With reaction (1) above occurring very slowly.
At FIG. 2, with a $Si_xH_yN_z$ amorphous layer:

  (3)

  (4)

The optimum values achievable with the practice of the principles of the invention can be derived from FIG. 3, which is a curve diagram of typical surface state densities, $N_{SS}$, measured by the conductance method with MOS capacitors. Section (a) indicates that value of the surface state density measured on a device after typical prior art hydrogen annealing, whereas section (b) indicates the surface state density value after applying an amorphous layer comprised of silicon and hydrogen on such device and annealing such device in accordance with the principles of the invention and section (c) illustrates the surface state density value obtained by following the principles of the invention, with the annealing occurring in a nitrogen atmosphere.

As can be seen from the FIG. 3 diagram in an exemplary presently preferred embodiment, an MOS device having a surface state density, $N_{SS}$ cm$^{-2}$eV$^{-1}$ of $4\times10^8$ cm$^{-2}$eV$^{-1}$ was achieved.

The principles of the invention are applicable to all SCCDs and all MOS devices with surface generated dark currents. The charge losses, $\epsilon$ of $1\times10^{-5}$ measured on SCCDs produced in accordance with the principles of the invention represent an important prerequisite for the use of such devices as highly integrated filters, memories, sensors, etc. The transfer properties thus attained are substantially optimal. As a result of the low surface state densities, the proportion of dark current due to surface generation is extremely small. In normal CCD operation of a device produced in accordance with the principles of the invention, the dark current is a factor of 3 smaller than in previously available devices.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for reducing the density of fast surface states in MOS devices, such as surface-charge-coupled devices (SCCDs), comprising:
    providing a MOS device having a Si-$SiO_2$ interface region with the $SiO_2$ defining a free surface of such device and having electrodes therein;
    depositing a relatively thin amorphous layer comprised of silicon, hydrogen and nitrogen from a reaction gas comprised of silanium and a nitrogen-containing gas at a given deposition temperature onto said $SiO_2$ free surface of the device; and
    annealing the resultant structure in a non-oxidizing atmosphere for a relatively brief period of time at a temperature in excess of said given deposition temperature and below about 500° C. whereby free valences at the Si-$SiO_2$ interface region are saturated with hydrogen and the density of fast surface states is reduced.

2. A process as defined in claim 1 wherein said nitrogen-containing gas is selected from the group consisting of $N_2$, $NH_3$ and mixtures thereof.

3. A process as defined in claim 1 wherein the maximum atomic ratio of nitrogen to silicon in said amorphous layer is about 1.3.

* * * * *